United States Patent [19]
Hamasaki

[11] Patent Number: 5,977,576
[45] Date of Patent: Nov. 2, 1999

[54] IMAGE SENSOR

[75] Inventor: Masaharu Hamasaki, Kanagawa, Japan

[73] Assignee: Sony Corporation, Tokyo, Japan

[21] Appl. No.: 08/803,275

[22] Filed: Feb. 20, 1997

[30] Foreign Application Priority Data

Feb. 21, 1996 [JP] Japan ..................................... 8-033230

[51] Int. Cl.⁶ ....................... H01L 31/062; H01L 31/113; H01L 31/06
[52] U.S. Cl. ........................... 257/292; 257/239; 257/386; 257/462; 257/463
[58] Field of Search ................................... 257/239, 292, 257/386, 461, 462, 463, 464

[56] References Cited

U.S. PATENT DOCUMENTS 5,008,723  4/1991  van der Have .......................... 257/386

FOREIGN PATENT DOCUMENTS 0513923  11/1992  European Pat. Off. ............... 257/386
60-251669  12/1985  Japan ..................................... 257/386

*Primary Examiner*—Ngân V. Ngô
*Attorney, Agent, or Firm*—Hill & Simpson

[57] ABSTRACT

In an image sensor 1 wherein an $N^+$-type impurity layer 13 to become a light-receiving part of a first conductive type is formed in a well layer 12 of a second conductive type (P-type) provided in a semiconductor substrate 11 of the first conductive type (N-type), an $N^-$-type impurity layer 14 whose impurity concentration is lower than that of the $N^+$-type impurity layer 13 and connected to the lower side of the $N^+$-type impurity layer 13 is provided between the $N^+$-type impurity layer 13 and the P-type well layer 12. Alternatively, a P-type impurity layer (not shown) whose impurity concentration is lower than that of the P-type well layer 12 and joining with the lower side of the $N^+$-type impurity layer 13 may be provided.

6 Claims, 3 Drawing Sheets

IMAGE SENSOR

BACKGROUND OF THE INVENTION

This invention relates to an image sensor.

A first conventional technology will be described with reference to the outline construction view of FIG. 1.

As shown in FIG. 1, this image sensor 110 uses a so-called photogate. That is, a photogate 112 is formed on a P-type semiconductor substrate 111. An N⁺-type first impurity layer 113 of this photogate 112 is formed in a state common with one of the diffusion layers of a transfer gate 114.

To the other N⁺-type second impurity layer 115 of the transfer gate 114, the gate of a source follower [for example constituted by a MOS (Metal-Oxide-Semiconductor) transistor] 121 is connected and one of the diffusion layers of a reset gate 122 is connected. Also, a vertical switch (for example constituted by a MOS transistor) 123 is connected to the source follower 121 in series.

Next, as a second conventional technology, an amplifying type MOS image sensor 130 of the kind shown in the outline construction view of FIG. 2 has been proposed from the technology research center of Nihon Hoso Kyokai.

That is, an N⁺-type impurity layer 131 to become a light-receiving part is formed in a part of an upper layer of a P-type semiconductor substrate (for example a silicon substrate) 111.

To the N⁺-type impurity layer 131, the gate of a source follower (for example constituted by a MOS transistor) 121 is connected and one of the diffusion layers of a reset gate 122 is connected. Also, a vertical switch (for example constituted by a MOS transistor) 123 is connected to the source follower 121 in series.

An image sensor of this kind is described in F. Andoh, K. Taketoshi, J. Yamazaki, M. Sugawara, Y. Fujita, K. Mitani, Y. Matuzawa, K. Miyata, S. Araki: "A 250,000-Pixel Image Sensor with FET Amplification at Each Pixel for High-Speed Television Cameras", ISSCC Digest of Technical Papers, pp. 212–213 (Feb. 1990).

When an image sensor of the construction shown in FIG. 1 is formed using a miniaturization CMOS process, the gate electrode of the photogate is formed with tungsten polycide. Consequently, the gate electrode becomes one which does not allow light to pass through. To avoid this, by adding and carrying out a so-called mask step, it is possible to remove a tungsten layer of the tungsten polycide and make it a construction of a gate electrode whose transmittivity of light has been raised. However, absorption of light by polysilicon, and particularly absorption of blue light, cannot be ignored.

Also, because red light penetrates as far as the inside of the substrate, and a P-type semiconductor substrate is used for the substrate, so-called inter-pixel crosstalk, wherein electrons photoelectrically converted in the P-type substrate itself enter the surrounding pixels, occurs. This is a serious problem in constructing a so-called 1-chip color image sensor.

Also, in an image sensor the occurrence of after-image and the realization of high sensitivity are in a so-called trade-off relationship. That is, during charge accumulation, the potential of the photogate is in a shallow state, and the potential of the transfer gate is in an intermediate state. The potential of the reset gate is in a shallow state. When it is operated in this kind of potential state, the transfer gate becomes a transverse type overflow gate, the voltage of the impurity layer (115) described with reference to the above-mentioned FIG. 1 becomes VDD and the impurity layer (115) becomes an overflow drain.

On the other hand, during detection, when the potential φRS of the reset gate is made deep and the source follower and the vertical switch are operated, switching noise (hereinafter called kTC noise) in the impurity layer (115) described with reference to the above-mentioned FIG. 1, which arises on cut-off of the reset gate, is detected.

Also, during signal detection, the potential of the photogate is made deep, the charge in the photogate and the impurity layer (113) described with reference to the above-mentioned FIG. 1 is moved to the impurity layer (115) and the potential of the impurity layer (115) is detected by the source follower and the vertical switch.

With the detection method described above, only the impurity layer (115) becomes so-called floating diffusion, the capacitance (capacitance) is the most small and kTC noise, which is switching noise, can be detected, and CDS (Correlated Double Sampling) is possible. In other words, realizing high sensitivity becomes easy.

However, because charge transfer from the impurity layer (113) through the transfer gate to the impurity layer (115) is by the BBD (Bucket Brigade Device) method, which is a method wherein a signal charge accumulates in a capacitor and this is transferred to the next capacitor in so-called bucket relay fashion by the switching action of a MOS-FET (field-effect transistor), after-image occurs.

When trying to eliminate after-image, it is necessary to raise the voltage of the transfer gate on resetting and reset both the impurity layer (113) and the impurity layer (115). At this time, the charge of the photogate is also reset.

In this case, after the potential φRS of the reset gate is made shallow, the voltage of the transfer gate is made high and charge in the photogate and the impurity layer (113) moves to the impurity layer (113) and the impurity layer (115) and the transfer gate and a potential is detected by the source follower and the vertical switch.

However, because the impurity layer (113) and the impurity layer (115) and the transfer gate become so-called floating diffusion, the capacitance (capacitance) of this so-called floating diffusion increases.

The image sensor described in the above-mentioned second conventional technology also produces inter-pixel crosstalk, for the same reasons as the above-mentioned first conventional technology. As a construction for avoiding the occurrence of this inter-pixel crosstalk, the kind of construction shown in the outline construction view of FIG. 3 has been proposed.

As shown in FIG. 3, this image sensor 140 is one obtained by, in the image sensor (130) described with reference to the above-mentioned FIG. 2, using an N-type semiconductor substrate 141 for the substrate, forming a P-type well layer 142 on that N-type semiconductor substrate 141, and forming an N⁺-type impurity layer 143 to become a light-receiving part on that P-type well layer 142. The construction of the source follower 121, the reset gate 122 and the vertical switch 123 is the same as the construction described with reference to the above-mentioned FIG. 2.

However, in processes miniaturizing MOS structures, because the impurity concentration of the P-type well layer 142 is coming to be set high, with the image sensor described with reference to the above-mentioned FIG. 3, the junction capacitance between the P-type well layer 142 and the N⁺-type impurity layer 143 increases. Consequently, because the charge detection capacitance (the junction capacitance pertaining to the N⁺-type impurity layer 143 and the interconnection capacitance as far as the source follower 121) becomes large, the detection sensitivity decreases.

SUMMARY OF THE INVENTION

This invention is an image sensor made to solve the above-mentioned problem.

That is, a first image sensor is one wherein a light-receiving part of a first conductive type is formed in a well of a second conductive type provided in a semiconductor substrate of the first conductive type and an impurity layer of the first conductive type whose impurity concentration is lower than that of the light-receiving part of the first conductive type is provided between this light-receiving part of the first conductive type and the well of the second conductive type.

In the first image sensor of the construction described above, because an impurity layer of the first conductive type whose impurity concentration is lower than that of the light-receiving part of the first conductive type is provided between the light-receiving part of the first conductive type and the well of the second conductive type, the capacitance between the light-receiving part of the first conductive type and the well of the second conductive type is reduced.

A second image sensor is one wherein a light-receiving part of a first conductive type is formed in a well of a second conductive type provided in a semiconductor substrate of the first conductive type and an impurity layer of the second conductive type whose impurity concentration is lower than that of this well of the second conductive type is provided between this light-receiving part of the first conductive type and the well of the second conductive type.

In the second image sensor of the construction described above, because an impurity layer of the second conductive type whose impurity concentration is lower than that of the well of the second conductive type is provided between the light-receiving part of the first conductive type and the well of the second conductive type, the capacitance between the light-receiving part of the first conductive type and the well of the second conductive type is reduced.

A third image sensor is one having a light-receiving part formed in a well layer of a second conductive type provided in a semiconductor substrate of a first conductive type and a transfer gate provided in the well layer of the second conductive type adjacent to this light-receiving part, and is one wherein the light-receiving part is made up of an impurity layer of the second conductive type whose impurity concentration is higher than that of the well of the second conductive type, a first impurity layer of the first conductive type formed in a state joining the lower part of this impurity layer of the second conductive type, and a second impurity layer of the first conductive type which is one formed in a state connecting with the lower part of this first impurity layer of the first conductive type and whose impurity concentration is lower than that of the first impurity layer of the first conductive type.

In the third image sensor of the construction described above, even when during readout the potential of the transfer gate is made a shallow state and the charge of the light-receiving part is moved by the transfer gate so that after-image does not occur, because on the lower side of the first impurity layer of the first conductive type constituting the light-receiving part the second impurity layer of the first conductive type whose impurity concentration is lower than that of this is formed in a connecting state, the capacitance between the first impurity layer of the first conductive type and the well layer of the second conductive type does not become large and this capacitance is reduced.

Also, because an impurity layer of the second conductive type is formed as a surface layer of the light-receiving part, the occurrence of surface dark current is prevented.

Furthermore, by using a semiconductor substrate of N-type as the first conductive type, because there ceases to be causing of photoelectric conversion due to incident light in the substrate itself, the occurrence of so-called inter-pixel crosstalk is prevented.

DETAILED DESCRIPTION OF THE PREFERRED EMBODIMENTS

An example of a first practicing mode of the invention will be described with reference to the outline construction view of FIG. 4.

Figure 1:
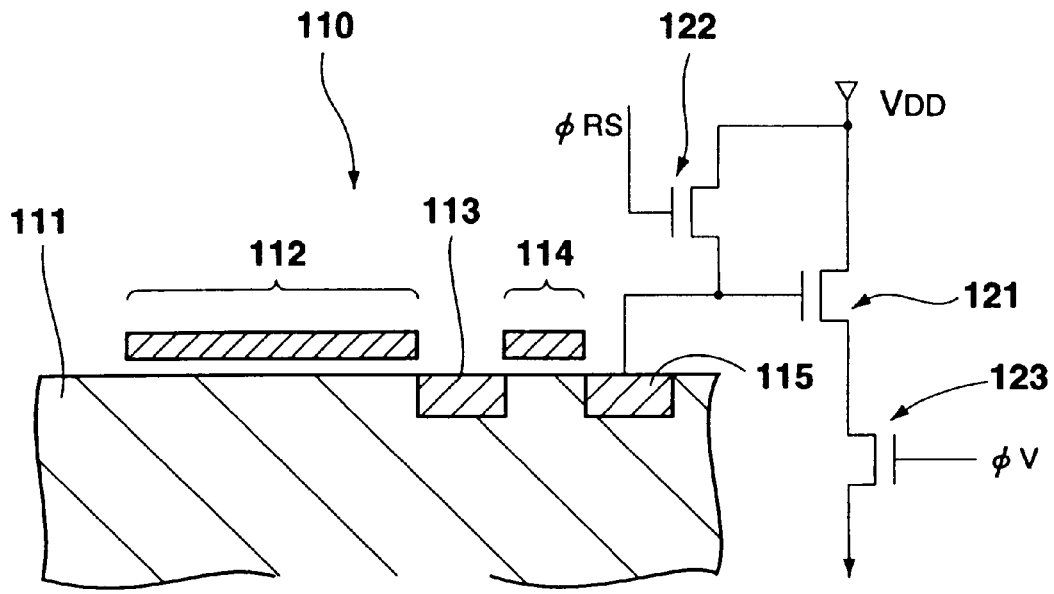
FIG. 1 is an outline construction view pertaining to a first conventional technology.
Figure 2:
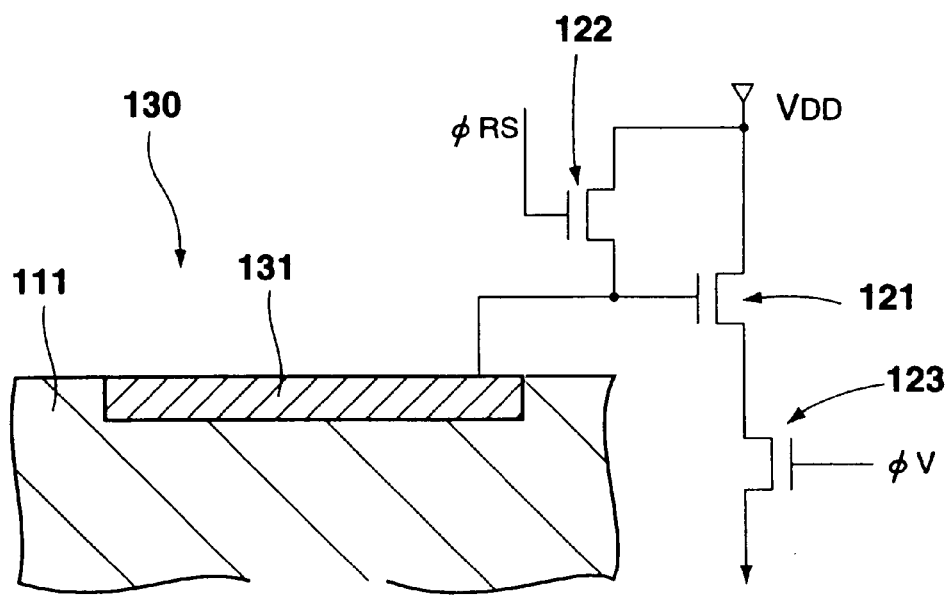
FIG. 2 is an outline construction view pertaining to a second conventional technology.
Figure 3:
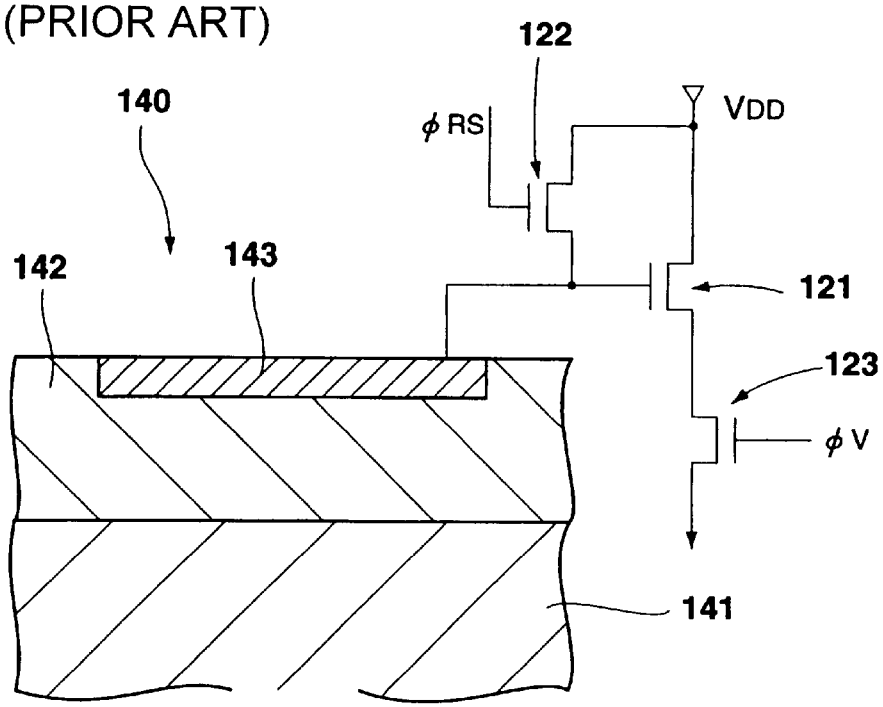
FIG. 3 is an outline construction view pertaining to a third conventional technology.
Figure 4:
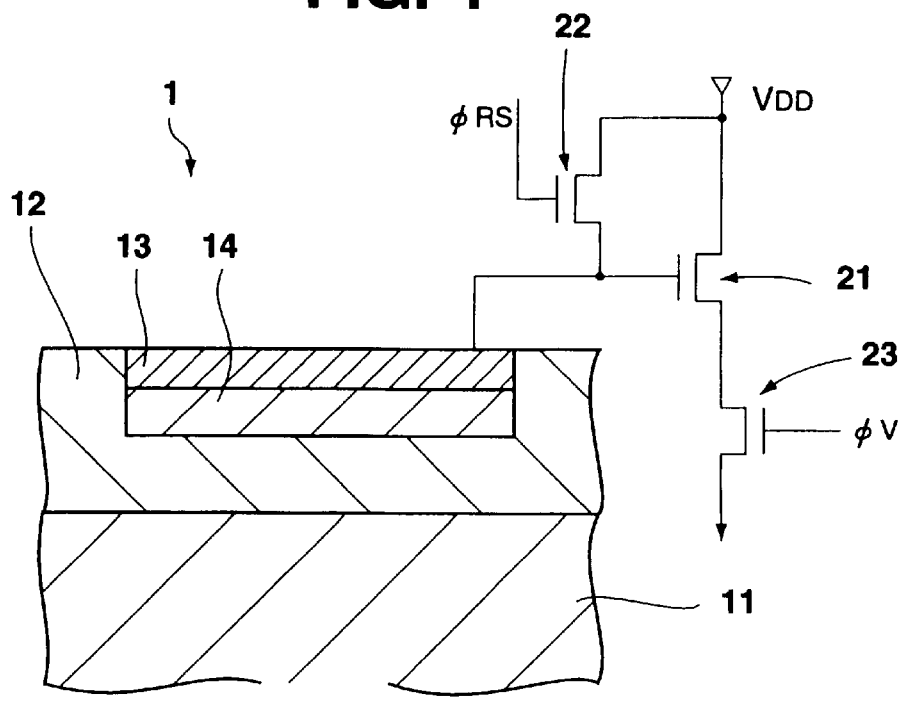
FIG. 4 is an outline construction view of a first practicing mode of the invention.

As shown in FIG. 4, an image sensor 1 is constructed as follows.

That is, in an upper layer of a semiconductor substrate (for example a silicon substrate) 11 of a first conductive type (hereinafter described taken as N-type) a well layer 12 of a second conductive type (hereinafter described taken as P-type) is formed, and an $N^+$-type impurity layer 13 to become a light-receiving part is formed in a part of an upper layer of that P-type well layer 12. This $N^+$-type impurity layer 13 is one wherein an N conductive type impurity (for example arsenic, phosphorus, antimony or the like) is diffused to a concentration of for example about $1 \times 10^{18}/cm^3$ to $1 \times 10^{22}/cm^3$.

Also, in a state connecting with the lower side of the $N^+$-type impurity layer 13, an $N^+$-type impurity layer 14 of lower impurity concentration than the $N^+$-type impurity layer 13 is formed. This $N^+$-type impurity layer 14 is one wherein an N conductive type impurity (for example arsenic, phosphorus, antimony or the like) is diffused to a concentration of for example about $1 \times 10^{13}/cm^3$ to $1 \times 10^{16}/cm^3$.

To the $N^+$-type impurity layer 13, the gate of a source follower (for example constituted by a MOS transistor) 21 is connected and one of the diffusion layers of a reset gate 22 is connected. A vertical switch (for example constituted by a MOS transistor) 23 is connected in series to the source follower 21.

In this image sensor 1, because the $N^-$-type impurity layer 14 is formed in a state connecting with the lower side of the $N^+$-type impurity layer 13, the capacitance between the $N^+$-type impurity layer 13 and the P-type well layer 12 is reduced.

Consequently, because the charge detection capacitance (the junction capacitance between the $N^+$-type impurity layer 13 and the P-type well layer 12 and the interconnection capacitance as far as the source follower 21) becomes small, the detection sensitivity increases.

Also, since because an N-type semiconductor substrate 11 is used there ceases to be causing of photoelectric conversion in the substrate itself, it is possible to prevent the occurrence of so-called inter-pixel crosstalk.

Also, with the image sensor 1 of the construction described above, it becomes possible to form it by adding only one ion implantation step to a complementary MOS process. Consequently, there is little process load.

An example of a second practicing mode of the invention will now be described with reference to the outline construction view of FIG. 5.

Figure 5:
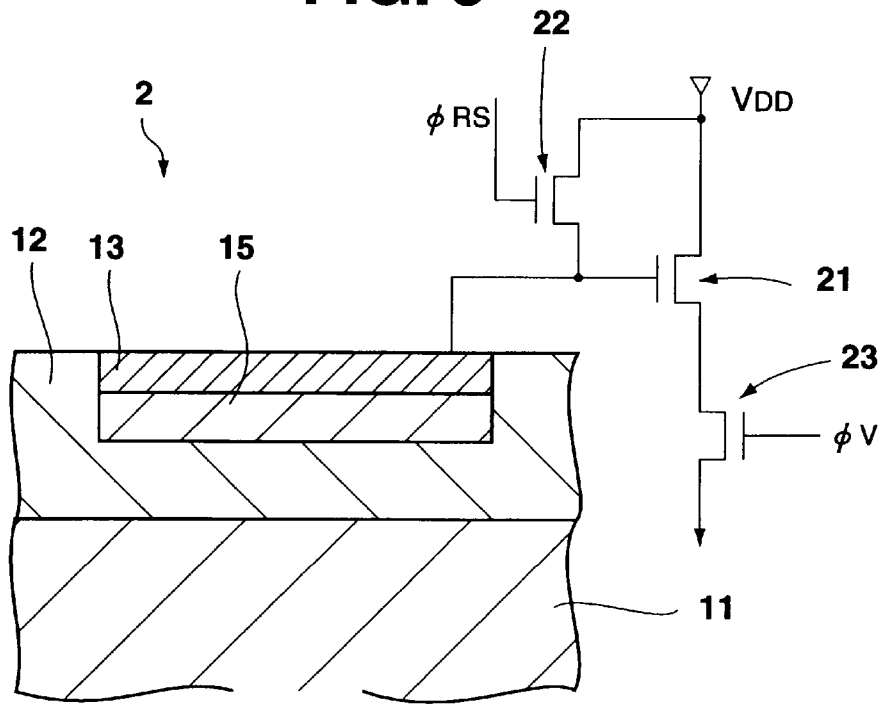
FIG. 5 is an outline construction view of a second practicing mode of the invention.

In FIG. 5, parts the same as constituent parts described in the first practicing mode described above are given the same symbols.

As shown in FIG. 5, an image sensor 2 is constructed as follows.

That is, in an upper layer of a semiconductor substrate (for example a silicon substrate) 11 of a first conductive type (hereinafter described taken as N-type) a well layer 12 of a second conductive type (hereinafter described taken as P-type) is formed, and an $N^+$-type impurity layer 13 to become a light-receiving part is formed in a part of an upper layer of that P-type well layer 12. This $N^+$-type impurity layer 13 is one wherein an N conductive type impurity (for example arsenic, phosphorus, antimony or the like) is diffused to a concentration of for example about $1 \times 10^{18}/cm^3$ to $1 \times 10^{22}/cm^3$.

Also, in a state joining with the lower side of the $N^+$-type impurity layer 13, a $P^-$-type impurity layer 15 of lower impurity concentration than the P-type well layer 12 is formed. This $P^-$-type impurity layer 15 is one wherein a P conductive type impurity (for example boron or the like) is diffused to a concentration of for example about $1 \times 10^{13}/cm^3$ to $1 \times 10^{16}/cm^3$.

To the $N^+$-type impurity layer 13, the gate of a source follower (for example constituted by a MOS transistor) 21 is connected and one of the diffusion layers of a reset gate 22 is connected. A vertical switch (for example constituted by a MOS transistor) 23 is connected in series to the source follower 21.

In the image sensor 2 of the construction described above, because the $P^-$-type impurity layer 15 is formed in a state joining with the lower side of the $N^+$-type impurity layer 13, the capacitance between the $N^+$-type impurity layer 13 and the P-type well layer 12 is reduced.

Consequently, because the charge detection capacitance (the junction capacitance between the $N^+$-type impurity layer 13 and the P-type well layer 12 and the interconnection capacitance as far as the source follower 21) becomes small, the detection sensitivity increases.

Also, since because an N-type semiconductor substrate 11 is used there ceases to be causing of photoelectric conversion in the substrate itself, it is possible to prevent the occurrence of so-called inter-pixel crosstalk.

Also, the P-type well layer 12 normally formed in a complementary MOS process is normally formed by ion implantation. Consequently, it is possible to control the concentration of a shallow region and the concentration of a deep region independently. In this kind of case, for example, by changing an ion implantation mask for forming a shallow region of the P-type well layer 12 to a mask such that impurity due to the ion implantation is not incident on the light-receiving part (the $N^+$-type impurity layer 13) and forming the P-type well layer 12, it is possible to adopt the construction of the second practicing mode described above.

Also, it may be made a construction wherein the construction of the first practicing mode described above and the construction of the second practicing mode described above are combined.

Although it is not shown in a drawing, in the same way as described above in the first practicing mode, an $N^+$-type impurity layer 13 to become a light-receiving part is formed in a part of an upper layer of a P-type well layer 12 and an $N^+$-type impurity layer 14 whose impurity concentration is lower than that of the $N^+$-type impurity layer 13 is formed in a state connecting with the lower side of this $N^+$-type impurity layer 13.

Also, a $P^-$-type impurity layer whose impurity concentration is lower than that of the P-type well layer 12 is formed in a state joining with the lower side of the $N^-$-type impurity layer 14. This $P^-$-type impurity layer is one wherein a P conductive type impurity (for example boron) is diffused to a concentration of for example about $1 \times 10^{13}/cm^3$ to $1 \times 10^{16}/cm^3$. Although in this example, the impurity layer 15 is made P-type, it may be substituted by an intrinsic semiconductor layer.

Next an example of a third practicing mode of the invention will be described with reference to the outline construction view of FIG. 6.

Figure 6:
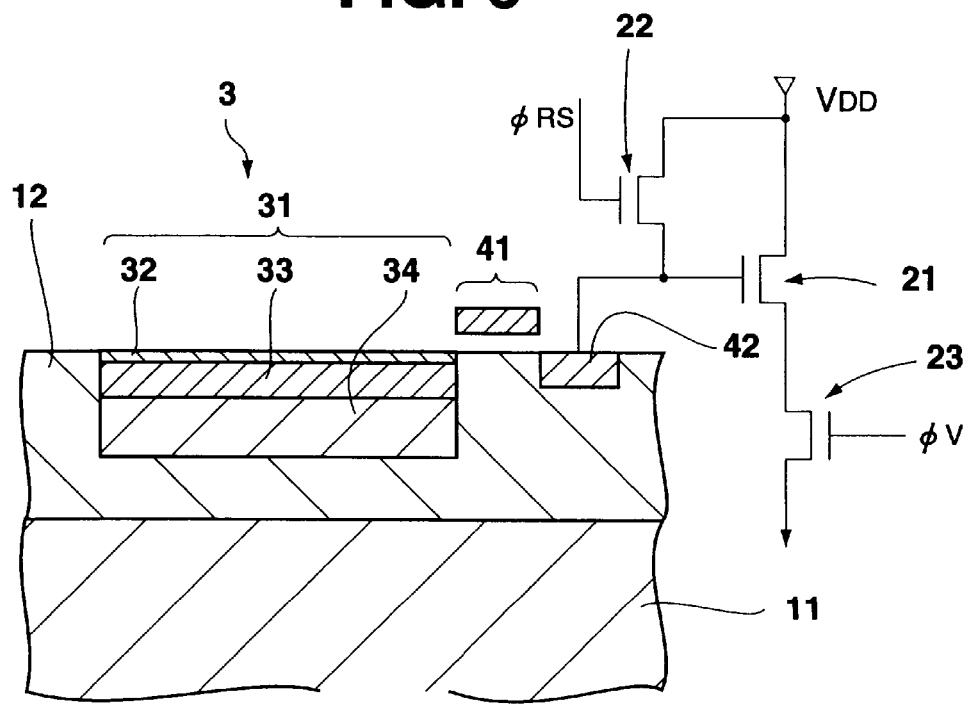
FIG. 6 is an outline construction view of a third practicing mode of the invention.

As shown in FIG. 6, an image sensor 3 is constructed as follows.

That is, in an upper layer of a semiconductor substrate (for example a silicon substrate) 11 of a first conductive type (hereinafter described as N-type) a well layer 12 of a second conductive type (hereinafter described as P-type) is formed, and a light-receiving part 31 is formed in a part of an upper layer of that P-type well layer 12. In this light-receiving part 31, a $P^+$-type impurity layer 32 is formed in an upper layer, an $N^+$-type impurity layer 33 is formed in a state joining with the lower side of this $P^+$-type impurity layer 32, and an $N^-$-type impurity layer 34 is formed in a state connecting with the lower side of this $N^+$-type impurity layer 33.

The $P^+$-type impurity layer 32 is one wherein a P conductive type impurity (for example boron) is diffused to a concentration of for example about $1 \times 10^{18}/cm^3$ to $1 \times 10^{22}/cm^3_1$, and the $N^+$-type impurity layer 33 is one wherein an N conductive type impurity (for example arsenic, phosphorus, antimony or the like) is diffused to a concentration of for example about $1 \times 10^{16}/cm^3$ to $1 \times 10^{19}/cm^3$. The $N^-$-type impurity layer 34 is one wherein an N conductive type impurity (for example arsenic, phosphorus, antimony or the like) is diffused to a concentration of for example about $1 \times 10^{13}/cm^3$ to $1 \times 10^{16}cm^3$.

The light-receiving part 31 is formed in a state common with one of the diffusion layers of a transfer gate 41. To the other $N^+$-type impurity layer 42 of the transfer gate 41, the gate of a source follower (for example constituted by a MOS transistor) 21 is connected and one of the diffusion layers of a reset gate 22 is connected. Also, a vertical switch (for example constituted by a MOS transistor) 23 is connected in series to the source follower 21.

In the image sensor 3 of the construction described above, even if during readout a high voltage is impressed on the transfer gate 41 to move charge from the light-receiving part 31 to the $N^+$-type impurity layer 42 so that after-image does not occur, because the $N^+$-type impurity layer 33 whose impurity concentration is lower than that of the $N^+$-type impurity layer 32 is formed in a state connecting with the lower side of the $N^+$-type impurity layer 32, the capacitance between the $N^+$-type impurity layer 32 and the P-type well layer 12 does not become large and this capacitance is reduced. Consequently, because the charge detection capacitance (the junction capacitance between the $N^+$-type impurity layer 32 and the P-type well layer 12 and the interconnection capacitance as far as the source follower 21) becomes small, the detection sensitivity increases.

Also, because the P$^+$-type impurity layer 32 is provided, the occurrence of surface dark current is avoided.

Also, since because an N-type semiconductor substrate 11 is used there ceases to be causing of photoelectric conversion in the substrate itself, the occurrence of so-called inter-pixel crosstalk is prevented.

Also, with the image sensor 3 described above, it becomes possible to form it by adding only two ion implantation steps to a complementary MOS process. Consequently, there is little process load.

In this example the impurity layer 34 was made N$^-$-type, but this may be replaced with an intrinsic semiconductor layer.

Also, in FIG. 6, any one of an N$^-$-type impurity layer whose impurity concentration is lower than that of the impurity layer 42, a P$^-$-type impurity layer whose impurity concentration is lower than that of the well layer 12 and an intrinsic semiconductor layer may be provided in a state joining with the lower side of the impurity layer 42.

Also, it may be made a construction wherein the construction of the second practicing mode described above and the construction of the third practicing mode described above are combined.

Although it is not shown in a drawing, a P$^-$-type impurity layer whose impurity concentration is lower than that of the P-type well layer 12 is formed in a state joining with the lower side of the N$^-$-type impurity layer 33. This P$^-$-type impurity layer is one wherein a P conductive type impurity (for example boron) is diffused to a concentration of for example about $1 \times 10^{13}/cm^3$ to $1 \times 10^{16}/cm^3$.

As described above, according to this invention, because as a result of using an N-type semiconductor substrate for a semiconductor substrate of the first conductive type there ceases to be causing of photoelectric conversion in the substrate itself, the occurrence of so-called inter-pixel crosstalk can be prevented, and because an impurity layer whose impurity concentration is lower than the impurity concentration of the light-receiving part or an impurity layer whose impurity concentration is lower than the impurity concentration of the well layer is provided between the light-receiving part and the well layer, it is possible to reduce the junction capacitance between the light-receiving part and the well layer. Therefore, as a result of inter-pixel crosstalk being prevented it becomes easy to constitute 1-chip color realization and as a result of the junction capacitance between the light-receiving part of the first conductive type and the well layer of the second conductive type being reduced it becomes possible to increase detection sensitivity. Also, since because even if it is operated so that after-image does not occur an increase in the junction capacitance does not result, decrease in the detection sensitivity does not occur.

Therefore the image sensor of the invention is a high-quality one.

What is claimed is:

1. A solid-state image-pickup device comprising:
    a semiconductor substrate of a first conductive type;
    a well layer of a second conductive type formed on said semiconductor substrate;
    a semiconductor region of the first conductive type formed over said semiconductor substrate;
    a light-receiving part of the first conductive type formed on said well layer producing a charge corresponding to an amount of incident light;
    a transfer gate formed between said light-receiving part and said semiconductor region to control an amount of said charge transferred from said light-receiving part to said semiconductor region;
    means for reducing capacitance disposed between said well layer and said light-receiving part; and
    means for converting charge to voltage connected to said semiconductor region.

2. A solid-state image-pickup device of claim 1, wherein said means for reducing capacitance is a semiconductor layer of the first conductive type whose impurity concentration is lower than that of said light-receiving part.

3. A solid-state image-pickup device of claim 1, wherein said means for reducing capacitance is a semiconductor layer of the second conductive type whose impurity concentration is lower than that of said well layer.

4. A solid-state image-pickup device of claim 1, wherein said means for reducing capacitance is an intrinsic semiconductor layer.

5. A solid-state image-pickup device of claim 1, wherein said means for converting charge to voltage includes a source follower.

6. An image generating device comprising:
    an N type semiconductor substrate;
    a well layer formed of a second conductive type formed on the substrate;
    a light receiving portion formed in the well layer, said light receiving portion comprised of a P+type impurity layer formed in an upper region, an N+impurity layer formed directly beneath the P+layer and an N– type impurity layer formed directly beneath the N+impurity layer.

* * * * *